United States Patent [19]

Yen et al.

[11] Patent Number: 5,061,989
[45] Date of Patent: Oct. 29, 1991

[54] MECHANICAL TRANSLATOR FOR SEMICONDUCTOR CHIPS

[75] Inventors: Yao T. Yen, Cupertino; Joonees K. Chay, San Jose, both of Calif.

[73] Assignee: TransComputer, Inc., Sunnyvale, Calif.

[21] Appl. No.: 498,273

[22] Filed: Mar. 22, 1990

[51] Int. Cl.$^5$ ............................ H02B 1/00; H01L 25/00
[52] U.S. Cl. ............................... 357/74; 357/80; 357/65; 361/409; 361/413
[58] Field of Search ................. 357/74, 70, 65, 80; 361/409, 413

[56] References Cited

U.S. PATENT DOCUMENTS 4,774,630  9/1988  Reisman et al. ................. 357/82

FOREIGN PATENT DOCUMENTS 58-147052  9/1983  Japan ................................ 357/75
61-59863   3/1986  Japan .
62-241359 10/1987  Japan .
63-237451 10/1988  Japan ................................ 357/74

OTHER PUBLICATIONS

"Mated Array Chip Configuration", IBM TDB, vol. 28, No. 2, 7/85, pp. 811-812.

"Semiconductor Packaging Using Chip Mate", IBM TDB, vol. 27, No. 11, Apr./85, pp. 6507-6508.

Primary Examiner—Andrew J. James
Assistant Examiner—Viet Q. Nguyen
Attorney, Agent, or Firm—Limbach, Limbach & Sutton

[57] ABSTRACT

Disclosed herein is a mechanical translator for use in replacing one semiconductor chip with another. A translator allows a first semiconductor chip to be replaced with second semiconductor chip. The translator includes a module having a first surface with a plurality of pins in a first pattern that is compatible with the contact pins of the first semiconductor chip and having a plurality of electrically conductive pads in a second pattern that is compatible with the contact pins of the second semiconductor. The module includes translating semiconductor logic for translating the electrical signals designed to be supplied to and received from the first second semiconductor chip to be compatible with the electronic signals supplied to and received from the second semiconductor chip. The electrical pads are appropriately connected to the translating logic. Also included is an adapter having pattern of pins and sockets compatible with the pattern of pins and sockets of the replacing semiconductor chip. The adapter is connectable in piggy back fashion with the module.

13 Claims, 2 Drawing Sheets

MECHANICAL TRANSLATOR FOR SEMICONDUCTOR CHIPS

FIELD OF THE INVENTION

This invention relates to electromechanical devices which are used in replacing one semiconductor chip with another and more particularly to electromechanical devices for semiconductor chips which are used to adapt the posts and sockets of one semiconductor chip to another. More particularly, this invention relates to an electromechanical device for sue with semiconductor chips, where the electromechanical device incorporates logic circuits for translating and adapting electronic signals provided at the electrical contacts of a device socket which were designed and intended to communicate with a first semiconductor chip to appropriately communicate with a second semiconductor chip.

BACKGROUND OF THE INVENTION

As is well documented in the history of the development of semiconductor chips, the only thing that remains constant is change. It has always been common for a new generation of semiconductor chip to replace the old generation. Currently, in areas of memory storage and microprocessors, the rate of change has been accelerating. This acceleration of new generations of semiconductor chips has the effect of obsoleting entire systems of computers in a matter of just a few months. Because the old generation of systems are fully understood and appreciated by the user that effort to achieve such understanding is wasted by the introduction of the new generation of systems.

For example, over the past three years, since Intel (Intel is a registered trademark of Intel Corp.) released their 80386 microprocessor, users have only begun to understand and appreciate the powers and capacities of the 80386. However, within the last eighteen (18) months, Intel released a new microprocessor, the 80486, which is designed to work even faster and have more capacity than the 80386 generation microprocessors.

In effect this not only obsoletes the recently released 80386, but also entire computer systems around which that semiconductor chip is based. Thus, a consumer may have spent $3,000.00–$4,000.00 or more to purchase his computer only a few months before and now, with the release of the new semiconductor chip his entire machine has become obsolete. Since the 80486 is so much more powerful than 80386, it is not only conceivable, but even likely that important software programs will be written for 80486 which will not be able to function effectively with the 80386. These software programs may include such important packages as time and billing for companies, internal computer organization and backup and a myriad of other programs which may not only be desirable for the business person but in fact necessary for completion in our increasingly competitive world.

At first blush it would seem a simple problem to replace one semiconductor chip with another, given that they are designed to perform basically the same function and that they may even be from the same manufacturer. Using the example of the Intel 80386/486, which are both microprocessors made by the same company, it is readily seen why the problem of replacing the old generation semiconductor chip with the new is quite challenging For example, the Intel 80386 microprocessor is a semiconductor chip manufactured in a pin grid array package having a 14 by 14 square array of electrical contact pins. As is well known, the center array of 8 by 8 pins is not installed so that there are 132 pins on the 80386 package. The Intel 80486 microprocessor is semiconductor chip manufactured in a pin grid array package having a 17 by ∫ square array of electrical contact pins. As is well known, the center array of 11 by 11 pins is not installed so that there are 168 pins on the 80486 package. Obviously, the 80486 can not simply plug into the slot provided for in the mother board of a computer designed to accept an 80386. Additionally, the electrical impulses read into and out of the 80386 will not be the same as the electrical impulses for the 80486. In fact, since the 80486 is a much more powerful semiconductor chip, there are eleven more power pins and twenty signal pins that are not present in the 80386. Accordingly, as will be typical with a new generation semiconductor chip, there are eleven more power pins and twenty signal pins that are not present in the 80386. Accordingly, additional semiconductor chip logical elements need to be added to the electrical impulses for the new generation semiconductor chip.

The new generation chip must be made to be compatible with the old generation mother board or like physical structure. The new generation chip must be able to read the electrical impulses of the old generation. The new generation chip must be able to output electrical impulses that are readable by the old generation mother board.

Additionally, in order to preserve the speed and other advantages of the new generation semiconductor chip, the electrical connection distances between the new semiconductor chip, the translating logic and the mother board must be kept to an absolute minimum. The electrical connection distance is important not only for purposes of speed, but also because long electrical connection lines encourage the connection lines to act as transmission line causing errors which may lead to a break down in the entire computer system.

Thus, a mechanical device which enables one semiconductor chip to replace another must meet the electrical limitations described herein. In addition to the electrical limitations, the mechanical device must also meet the physical limitation of the environment. In the case of the Intel 80386/486, the 486 is much larger physically and additional logical elements must be provided for translation of 386 input/output signals to 486 input/output signals and vice versa. Thus, initial attempts at mechanical adapters which included by laying the necessary elements in a side-by-side relationship failed, not only for electrical reasons, but also because, such an arrangement was physically incompatible with the tight physical environment of a microcomputer.

In solving this long felt need of saving equipment even after the essential semiconductor chip is outmoded and made obsolete by a new generation semiconductor chip, the mechanical translator in accordance with this invention utilizes a piggy back mounting system which minimizes electrical connection distances and gives the mechanical translator a low profile.

SUMMARY OF THE INVENTION

It is an object of this invention to provide a mechanical translator which is compatible with the electrical and physical limitations of the semiconductor chip environment.

It is a further object of this invention to provide a mechanical translator which allows a new generation semiconductor chip to replace an old generation semiconductor chip in the same equipment which is transparent to the user.

It is a further object of this invention to provide a mechanical translator which allows a new generation semiconductor chip to replace an old generation semiconductor chip in the same equipment and which closely matches the performance standards of the new semiconductor chip.

In accordance with the above objects and those that will be mentioned and will become apparent below, the mechanical translator in accordance with this invention comprises:

a module having a compatible pattern of pins with the first semiconductor chip and having openings comprising electrically conductive pads in the pattern of pins of the second semiconductor chip;

the module including translating semiconductor logic for translating the electrical impulses of the second chip to be compatible with the first chip; and the electrical pads being appropriately connected to the translating logic, whereby, the second semiconductor chip is connectable to the module and the module is connectable to a p.c. board.

In this first embodiment of the mechanical translator in accordance with the invention, the piggy back mounting of the module and new generation semiconductor chip allows the electrical connection length of the module pins and conductive pads with the translating logic to be minimized so that the speed is compatible with the speed of the new generation semiconductor chip as well as discouraging to the maximum extent possible transmission line propagation and similar difficulties.

Additionally, the piggy back mounting enables the mechanical translator to have a low profile so as to be compatible with the physical environment of the semiconductor chip.

An additional embodiment of the mechanical translator in accordance with this invention, comprises:

a module having a first surface with a plurality of pins in a compatible pattern with the first semiconductor chip and having openings comprising electrically conductive pads in the pattern of pins for the second semiconductor chip, the module including translating semiconductor logic for translating the electrical impulses of the second chip to be compatible with the first chip, and the electrical pads being appropriately connected to the translating logic; and an adapter having pattern of pins and sockets compatible with the pattern of pins and sockets of the second semiconductor chip and the adapter is connectable in piggy back fashion with the module, whereby, the second semiconductor chip is connectable to the adapter and the module is connectable to a p.c. board.

In the second embodiment, the mechanical translator includes an adapter which is preferably press-fit or soldered or in some other way permanently connected to the module. This is the current existing embodiment of the invention and it is believed to be the best operating example of the mechanical translator in accordance with this invention.

It is an advantage of this invention to provide a mechanical device which will allow a user to keep his equipment current without having to throw away his existing equipment.

It is an additional advantage of this invention to provide a mechanical translator which is transparent to the user and which minimizes electrical connection distances and which has a low profile.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein.

DETAILED DESCRIPTION OF THE INVENTION

Figure 1:
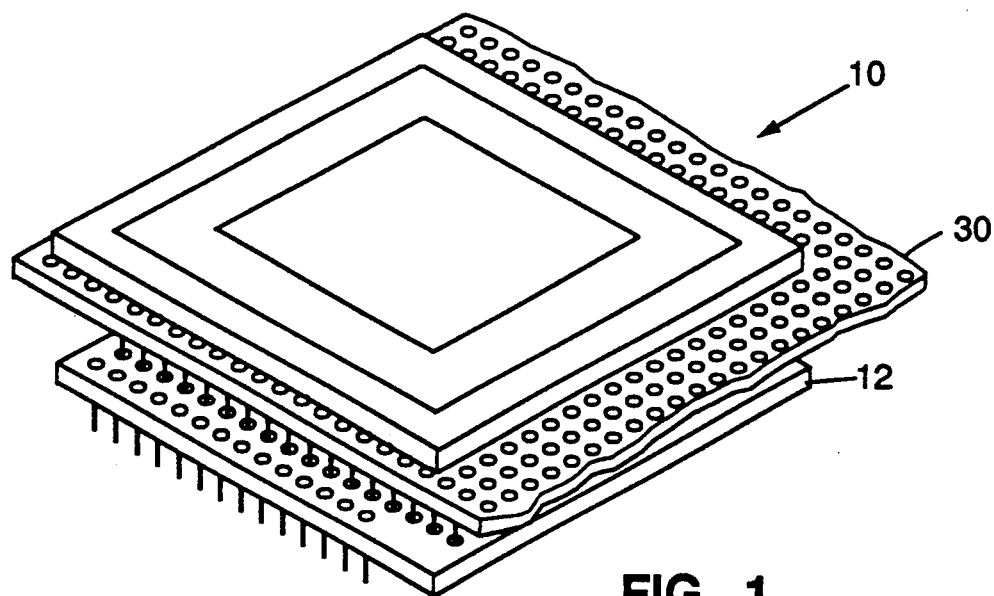
FIG. 1 is an elevated perspective partial plan view of the mechanical translator in accordance with this invention in connection with an Intel 80486 semiconductor chip.

The invention will now be described with respect to FIGS. 1-5, which illustrates the mechanical translator in accordance with this invention generally designated by the numeral 10. The mechanical translator 10 enables the translation of the electrical signals intended to be provided to and received from a first semiconductor chip so that a second semiconductor chip with different input and output signal requirements can be used in its place. In the preferred embodiment of the invention, the mechanical translator 10 is used to replace an Intel 80386 with an Intel 80486.

The mechanical translator 10 includes a module board 12 having a pattern of electrical contact pins 14 and sockets 16. In the preferred embodiment, the pins 14 are compatible with the pins of the 80386 and are plugged into the socket on the computer intended to receive the 80386. The sockets 16 are compatible to receive the pins of an 80486. As will be more fully appreciated hereinafter, the pattern of sockets 14 of the module board 12 need not match the semiconductor chip to be replaced. However, since with present technology the pins and sockets are part of the same physical structure of course what is stated herein about pins will apply equally to sockets. If technology should change regarding the physical structure of pins and sockets, the above caveat will be understood so as not to limit the invention in any way.

The module board 12 further includes a plurality of openings, defining electrically conductive pads 18. The pads 18 form a pattern which is compatible with the pattern formed by the semiconductor chip which replaces the former semiconductor chip. In the preferred embodiment, the pads 18 form a pattern which matches and which is, in fact, identical to the pattern of pins for the Intel 80486. Thus, an 80486 can be mounted directly into the pad 18 and soldered in place. However, preferably an adapter board 30 which will accept an 80486 is mounted and soldered into the pads 18. In this manner, the 80486 can be replaced in the event of a failure of that device. Further, the module 10 can be manufactured and sold with an inexpensive socket which requires relatively simpled handling rather than soldered with a The module board 12 is preferably made from an ordinary p.c. board to reduce costs and provide sufficient and readily available materials for manufacture. As shown clearly in FIG. 2, the pattern of pads 18 and pins 14 are physically interwoven in the thickness of the module board 12.

Figure 2:
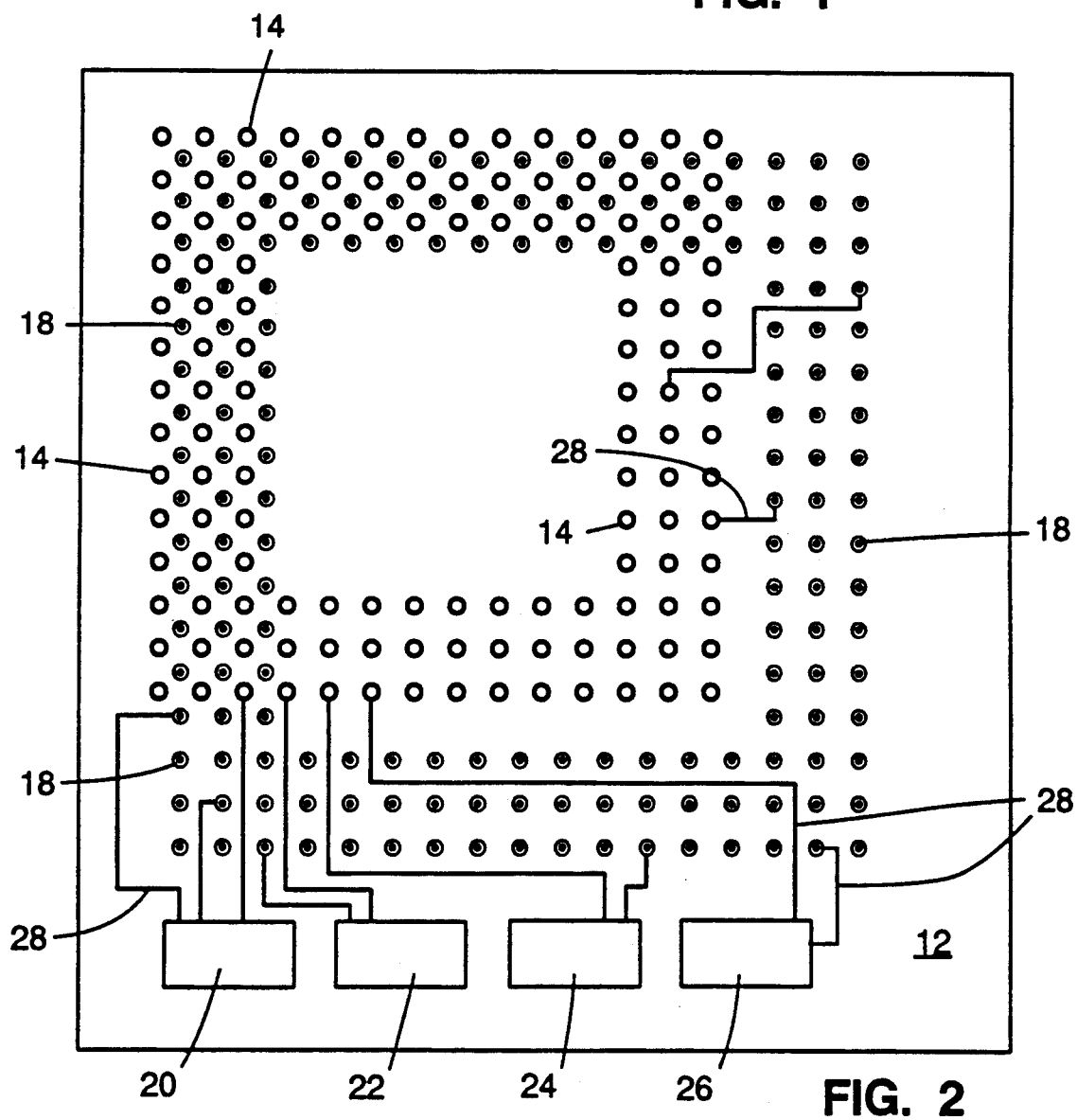
FIG. 2 is a top plan view of the module board of the mechanical translator of FIG. 1.
Figure 3:
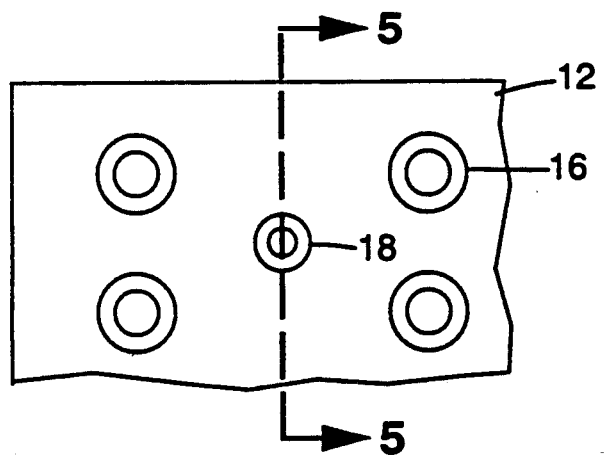
FIG. 3 is a top sectional view of a portion of the module board of the mechanical translator of FIG. 1.

In order to minimize the distance between the pads and the pins, thereby reducing the physical size of the module board 12, the pads 18 and pins 14 have a uniform pattern as illustrated in FIGS. 2 and 3. And as further illustrated in FIG. 3, the pads 18 are spaced equidistant from the pins 14 (and sockets 16). In fact, it has been empirically determined that placing one of the pads 18 equidistant among four (4) pins 14 (sockets 16), an ideal pattern is achieved for the preferred embodiment of the mechanical translator 10.

Figure 4:
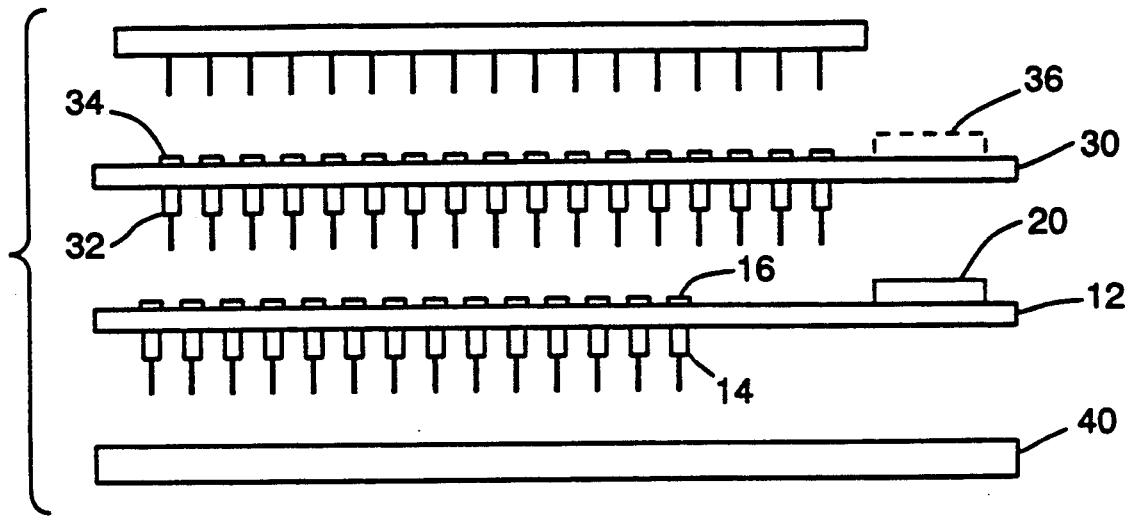
FIG. 4 is an exploded side elevational view of the mechanical translator of FIG. 1.
Figure 5:
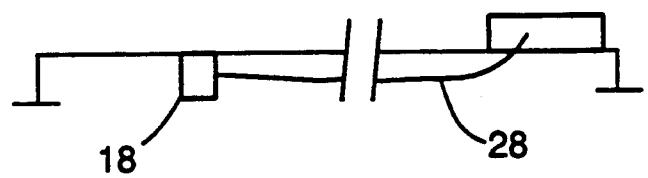
FIGS. 5 is a sectional view of the mechanical translator in accordance with this invention illustrating the connection of electrical pads to the translating logic.

As further illustrated in FIGS. 2, 4 and 5, the module board 12 includes translating logic represented in schematic by logic blocks 20-26. Logic blocks 20-26 include the digital semiconductor logic to translate Intel 80486 electrical impulses to compatible Intel 80386 electrical impulses. Logic blocks 20-26 include integrated chips generally available from Advanced Micro Devices which are combinational logic and registers, namely PAL16R4, PAL16R6 and PAL16L8.

The pads 18 are electrically connected to one of the logic blocks 20-26 as appropriate by a collection of electrically conductive lines 28. Likewise, the pins 14 are appropriately connected to one of the logic blocks 20-26 by the electrically conductive lines 28.

The mechanical translator 10 additionally includes an adapter board 30. Although in future applications, it is conceivable that the mechanical translator 10 may not include the adapter board 30, the preferred embodiment includes the adapter board 30. Without an adapter board 30, the replacing semiconductor chip will connect directly to the module board 12.

The adapter board 30 comprises a semiconductor chip pin and socket set mounted in a standard p.c. board. This again adds to the economy, reliability and availability of the final product. The adapter board 30 has a plurality of pins 32 and sockets 34 defining a pattern which matches the pattern pins and sockets of the replacing semiconductor chip, namely the Intel 80486.

The pins 32 of the adapter board 30 align with the pads 18 of the module board 12. It is to be noted that the pads 18 can not and do not align with the sockets 16 of the module board 12 for the preferred embodiment. The adapter board 30 is connected in piggy back to the module board 12. This minimizes the physical space taken up by the mechanical translator 10 and minimizes the electrical connections distance between the pads 18 and the logic blocks 20-26.

The adapter board 30 is connected to the module board 12 in a permanent fashion by press fit connection of the pins 32 to the pads 18. Alternatively, the pins 32 may be connected to the pads 18 by soldering.

In an alternative embodiment, it is conceivable that the adapter board 30 may include logic blocks 36, illustrated in phantom in FIG. 4. In that embodiment, the pins 32 would be electrically connected to the logic blocks 36 by electrically conductive lines (not shown). However, the preferred embodiment does not include logic blocks 36 on the adapter board 30.

As shown particularly in FIG. 4, the replacing semiconductor chip pins are aligned with the sockets 34 of the adapter board 30 and are plugged into same for electrical and physical connection therewith. The adapter board 30 is press fit into the module board 12. Also, the module board 12 is plugged into a p.c. board 40. It will be appreciated that the p.c. board 40 may comprise a so called mother board. In the case of the preferred embodiment, the p.c. board 40 does in fact describe the mother board for an Intel 80386 based micro computer. The mechanical translator 10 may be removed from the mother board as necessary.

While the foregoing detailed description has described several embodiments of the mechanical translator in accordance with this invention, it is to be understood that the above description is illustrative only and not limiting of the disclosed invention. Particularly, the mechanical translator 10 may be used for other semiconductor chips besides Intel's 80386/486. It will be appreciated that the mechanical translator described herein contemplates uses with various different microprocessors and other logic units and that these too are to be considered within the spirit and scope of this invention. Thus, the invention is to be limited only by the claims as set forth below.

What is claimed is:

1. A mechanical translator for allowing a first semiconductor chip having a pre-defined first pattern of first pins to replace a second semiconductor chip having a pre-defined second pattern of second pins on a p.c. board, the translator comprising:

a module having a first surface with a plurality of third pins in the second pattern and having electrical first sockets arranged in a pattern to receive the first pins, the module including translating semiconductor logic for translating the electrical impulses applied to the second chip to be compatible with the first chip and for translating impulses generated by the first chip to be compatible with the p.c. board, and the sockets an third pins being appropriately connected to the translating logic; and an adapter having pattern of fourth pins and second sockets compatible with the first pattern and the adapter is connectable in piggy back fashion with the module, whereby, the second semiconductor chip is connectable to the adapter and the module is connectable to a p.c. board.

2. A mechanical translator as set forth in claim 1, wherein the adapter is non-removably connected to the module.

3. A mechanical translator as set forth in claim 1, wherein the adapter is press fit connected to the module.

4. A mechanical translator as set forth in claim 1, wherein the adapter is solder connected to the module.

5. A mechanical translator as set forth in claim 1, wherein a portion of the third pins on the module are interwoven with a portion of the first sockets.

6. A mechanical translator as set forth in claim 5, wherein both the first sockets and the third pins are in a uniform pattern and wherein the third pins and first sockets which are interwoven are spaced equidistant from one another.

7. A mechanical translator as set forth in claim 6, wherein the distance between the third pins and the first sockets are minimized.

8. A piggy back translator for adapting an Intel 80486 semiconductor chip to a socket for an Intel 80386 semiconductor chip, comprising:
a module having a first surface with a pattern of pins matching the pattern of pins of a Intel 80386 semiconductor chip, the module having a second surface with sockets in a pattern to receive pins from the Intel 80486 semiconductor chip, the module including translating semiconductor logic for translating the input electrical impulses received on the pins of the module to be compatible with input electrical impulses for the Intel 80486 semiconductor chip and for translating the output electrical impulses received on the sockets to be compatible with the output electrical impulses for the Intel 80386 semiconductor chip and the pins and sockets being appropriately coupled to the translating logic.

9. A mechanical translator as set forth in claim 8, wherein both the pins and the sockets are in a uniform pattern, wherein a portion of the pins are interwoven with a portion of the sockets and wherein the pads which are interwoven with the sockets are spaced equidistant between the sockets.

10. A mechanical translator as set forth in claim 8, wherein the distance between the posts and the pads are minimized.

11. A translator apparatus for replacing a first semiconductor device with a second semiconductor device in a target circuit, the first device having a first plurality of first electrical contact members arranged in a first pattern, a first portion of the first members for providing input signals to the first semiconductor device from the target circuit and a second portion of the first members for receiving output signals form the first semiconductor device for the target circuit and the second device having a second plurality of second electrical contact members arranged in a second pattern, a first portion of the second members for providing input signals to the second semiconductor device and a second portion of the second members for receiving output signals from the second semiconductor device, the translator comprising:
a) a first plurality of third electrical contact members arranged in the first pattern to emulate the first members for receiving input signals from the target circuit intended for the first device;
b) an input logic circuit coupled to receive the input signals intended for the first device from the third members for translating the input signals intended for the first device into translated input signals acceptable to the second device;
c) a second plurality of fourth electrical contact members arranged in a mirror image of the second pattern to receive the second members and coupled to receive the translated input signals; and
d) an output logic circuit coupled to receive the output signals from the second semiconductor device form the fourth members for translating the output signals from the second semiconductor device into translated output signals acceptable to the external circuit.

12. A mechanical translator as set forth in claim 11, wherein the first pattern is interwoven with the second pattern.

13. A mechanical translator as set forth in claim 11, wherein both the third pins and the first sockets are in a uniform pattern and wherein the second members that are interwoven are spaced equidistant between the first members.

* * * * *

UNITED STATES PATENT AND TRADEMARK OFFICE
CERTIFICATE OF CORRECTION

PATENT NO. : 5,061,989

DATED : October 29, 1991

INVENTOR(S) : Yao T. Yen and Joonees K. Chay

Page 1 of 3

It is certified that error appears in the above-indentified patent and that said Letters Patent is hereby corrected as shown below:

In the Abstract:

Delete the entire first sentence, "Disclosed herein is a mechanical translator for use in replacing one semiconductor chip with another".

In column 1, lines 9-12, after "another" please delete "and more particularly to electromechanical devices for semiconductor chips which are used to adapt the posts and sockets of one semiconductor chip to another".

In column 1, line 13, delete "sue" and replace with --use--.

In column 1, line 33, after "user" insert --,--.

In column 2, line 2, after "challenging" insert --.--.

UNITED STATES PATENT AND TRADEMARK OFFICE
CERTIFICATE OF CORRECTION

PATENT NO. : 5,061,989
DATED : October 29, 1991
INVENTOR(S) : Yao T. Yen and Joonees K. Chay It is certified that error appears in the above-indentified patent and that said Letters Patent is hereby corrected as shown below:

In column 2, line 10, delete "$\int$" and replace with --17--.

In column 2, lines 19-20, after "chip," delete "there are eleven more power pins and twenty signal pins that are not present inthe 80386. Accordingly,".

In column 2, line 25, after "to" insert --translate--.

In column 5, line 5, delete "simpled" and replace with --simple--.

In column 5, line 5, after "a" insert --80486--.

In column 6, line 10, delete "so called" and replace with --so-called--.

UNITED STATES PATENT AND TRADEMARK OFFICE
CERTIFICATE OF CORRECTION

PATENT NO. : 5,061,989
DATED : October 29, 1991
INVENTOR(S): Yao T. Yen and Joonees K. Chay It is certified that error appears in the above-identified patent and that said Letters Patent is hereby corrected as shown below:

In claim 11, column 8, line 1, delete "form" and replace with --from--.

In claim 11, column 8, line 25, delete "form" and replace with --from--.

Signed and Sealed this

Twenty-ninth Day of June, 1993

Attest:

MICHAEL K. KIRK

*Attesting Officer*   *Acting Commissioner of Patents and Trademarks*